(12) United States Patent
Bar-Lev (10) Patent No.: US 8,933,761 B2
(45) Date of Patent: Jan. 13, 2015

(54) PARALLEL SYNCHRONOUS BUS WITH NON-UNIFORM SPACED CONDUCTIVE TRACES FOR PROVIDING EQUALIZED CROSSTALK

(75) Inventor: Eldad Bar-Lev, Kiryat Tivon (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 305 days.

(21) Appl. No.: 13/357,693

(22) Filed: Jan. 25, 2012

(65) Prior Publication Data

US 2012/0193134 A1     Aug. 2, 2012

Related U.S. Application Data

(60) Provisional application No. 61/437,187, filed on Jan. 28, 2011, provisional application No. 61/512,681, filed on Jul. 28, 2011.

(51) Int. Cl.
*H01P 3/08*     (2006.01)
*H05K 1/02*     (2006.01)
*G06F 13/38*     (2006.01)

(52) U.S. Cl.
CPC ............ *H05K 1/0216* (2013.01); *H05K 1/0248* (2013.01); *H01P 3/082* (2013.01); *G06F 13/38* (2013.01); *H05K 2201/09227* (2013.01); *H05K 2201/09236* (2013.01); *H05K 2201/09672* (2013.01); *H05K 2201/09709* (2013.01)
USPC ................................................. 333/1; 333/238

(58) Field of Classification Search
CPC .......... H01P 3/08; H01P 3/082; H01K 1/0248
USPC ....................................................... 333/1, 238
See application file for complete search history.

(56) References Cited

U.S. PATENT DOCUMENTS

| 6,614,325 | B1 * | 9/2003 | Kocin | 333/12 |
| 7,292,449 | B2 * | 11/2007 | Hall et al. | 361/749 |
| 2008/0142248 | A1 * | 6/2008 | Lee | 174/250 |
| 2011/0095839 | A1 * | 4/2011 | Chu | 333/4 |

* cited by examiner

*Primary Examiner* — Benny Lee (57) ABSTRACT

Systems and methods are provided a circuit interconnect. In one embodiment of the disclosure, the circuit interconnect includes a dielectric layer. A parallel synchronous bus is disposed on the dielectric layer. The parallel synchronous bus includes at least four conductive traces. The conductive traces are non-uniformly spaced from one another along a portion of the bus where the conductive traces are physically aligned in parallel so that crosstalk interference among the conductive traces is equalized across the conductive traces.

13 Claims, 7 Drawing Sheets

PARALLEL SYNCHRONOUS BUS WITH NON-UNIFORM SPACED CONDUCTIVE TRACES FOR PROVIDING EQUALIZED CROSSTALK

CROSS-REFERENCE TO RELATED APPLICATIONS

This application claims priority to U.S. Provisional Patent Application No. 61/437,187, filed Jan. 28, 2011, entitled "Board with Equalized Crosstalk for Parallel Busses," and to U.S. Provisional Patent Application No. 61/512,681, filed Jul. 28, 2011, entitled "Board with Equalized Crosstalk for Parallel Busses," both of which are herein incorporated in their entirety.

FIELD

The technology described herein relates generally to circuit interconnects and more particularly to circuit interconnect interference control.

BACKGROUND

When routing signal carriers for parallel interfaces, such as electrically conducting printed circuit board traces, the spacing between the signal carriers is generally uniform throughout a portion of an interface whereat those signal carriers run physically parallel to one another. For parallel synchronous busses, where data is divided among of the signal carriers of the parallel interface and transmitted at the same time (e.g., in accordance with a clock signal), crosstalk interference among the signal carriers may become significant to the point of reduction of data throughput capabilities. Because a parallel synchronous bus requires the simultaneous transmission of data along all of the signal carriers of the bus, the signal carrier most affected by interference imposes an upper limit on the maximum transmission speed of the entire bus.

The description above is presented as a general overview of related art in this field and should not be construed as an admission that any of the information it contains constitutes prior art against the present patent application.

SUMMARY

Examples of systems and methods are provided for a circuit interconnect. In one embodiment of the disclosure, the circuit interconnect includes a dielectric layer. A parallel synchronous bus is disposed on the dielectric layer. The parallel synchronous bus includes at least four conductive traces. The conductive traces are non-uniformly spaced from one another along a portion of the bus where the conductive traces are physically aligned in parallel so that crosstalk interference among the conductive traces is substantially equalized across the conductive traces.

In another embodiment of the disclosure, a circuit interconnect includes a dielectric layer and a plurality of vias through the dielectric layer. The vias are configured so that crosstalk interference among the vias is at a substantially equal level across the vias. The configuration includes one or more of a positioning of one of the vias on the circuit interconnect relative to other vias, a size of one of the vias relative to the other vias, and a material composition of one of the vias relative to the other vias.

DETAILED DESCRIPTION

Parallel synchronous buses are commonly used to connect circuit components such that the circuit components can communicate data uni-directionally or bi-directionally (analog or digital). A conventional parallel synchronous bus can include a number of signal carriers that are physically aligned in parallel and that are configured to transmit data synchronously in time with the clock signal, enabling high data through rates (e.g., eight data lines synchronously transmit one bit of a byte). While a parallel, synchronous bus can enable high data rates, such busses can be susceptible to certain types of interference that may, in practice, limit the speed at which data can be transmitted. For example, transmission of data along the signal carriers (e.g., electrically conducting traces on a printed circuit board or ball grid array substrate) that run parallel along the bus may create a capacitive or inductive coupling commonly referred to as crosstalk interference or jitter. Crosstalk interference, often measured in units of mV, experienced by a signal carrier can limit the maximum data throughput capability of that signal carrier. Because the signal carriers of a parallel synchronous bus transmit respective portions of a larger unit of data at the same time, the signal carrier most affected by interference, and thus having the lowest maximum data rate, becomes the limiter of the maximum data rate for the entire bus because all of the other signal carriers of the parallel synchronous bus must be slowed to the data rate on the signal carrier most affected by interference in order for data transferred on the bus to remain synchronized.

Figure 1:
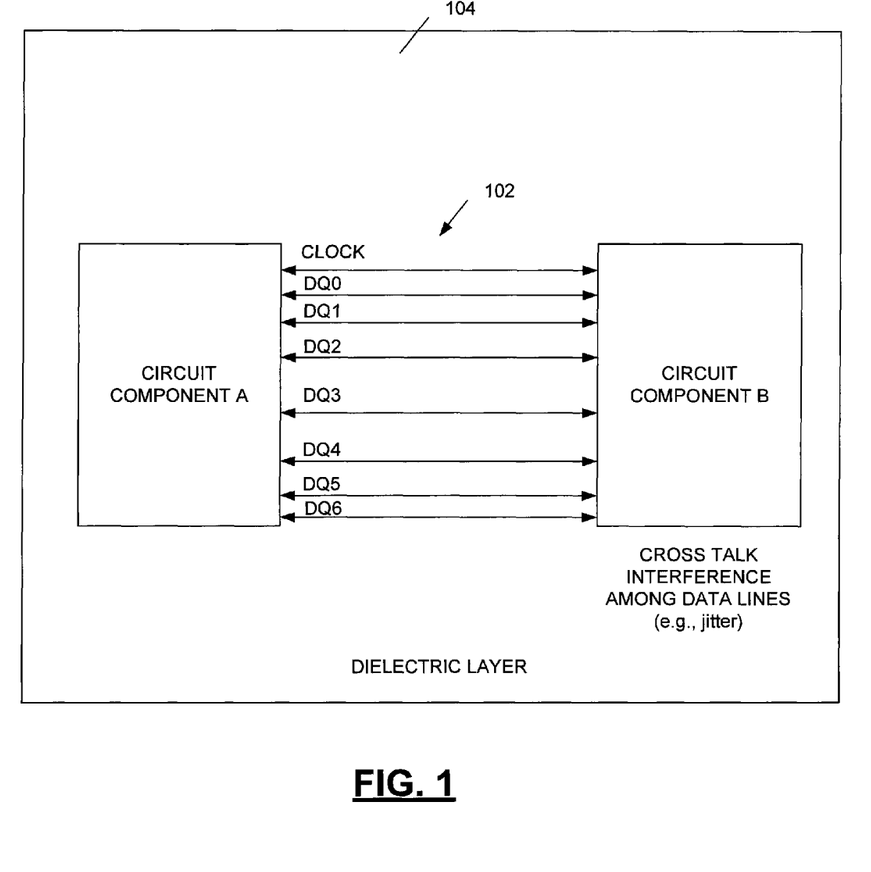
FIG. 1 depicts a parallel synchronous bus having non-uniformly spaced traces.

To combat the transmission bottleneck created by the above described crosstalk interference, in an embodiment, the signal carriers are positioned to increase the lowest maximum data rate of the most affected signal carrier between a first circuit Component A and a second Circuit Component B. which, in one embodiment, is controlled according to a Clock signal. FIG. 1 depicts a parallel synchronous bus having non-uniformly spaced traces, in an embodiment. The amount of crosstalk (or other) interference experienced by a data line is inversely proportional to the distance between that data line and other data lines. Because a data line in the center of a parallel synchronous bus 102 (e.g., DQ3) is aligned (positioned) proximate to a relatively larger number of data lines than a data line (e.g., DQ6) on the outside of the parallel synchronous bus 102, the central data line is susceptible to a larger number of closely positioned sources (aggressors) of crosstalk interference. By aligning other traces of the parallel synchronous bus 102 further from the central data lines, the crosstalk interference experienced by those central lines can be reduced. To satisfy bus width constraints, such as the maximum amount of space on the dielectric layer 104 that the parallel synchronous bus 102 is permitted to occupy, the outside data lines (e.g., DQ0, DQ1 and DQ5, DQ6) are aligned closer together than the central data lines (e.g., DQ2, DQ3 and DQ4). In this configuration, the crosstalk interference experienced by the central data lines is reduced, while the crosstalk interference experienced by the outer data lines of the parallel synchronous bus 102 is increased. A best maximum achievable data rate may be realized when the crosstalk interference level is equalized across all of the data lines, in an embodiment. It is noted that in other configurations of non-uniform spacing among the data lines of a parallel synchronous bus, a non-equalized interference level may result in an even further reduction in crosstalk interference level at the most affected data lines. Such configuration facilitates an even further improvement in the maximum rate at which data can be transferred on the bus.

Figure 2:
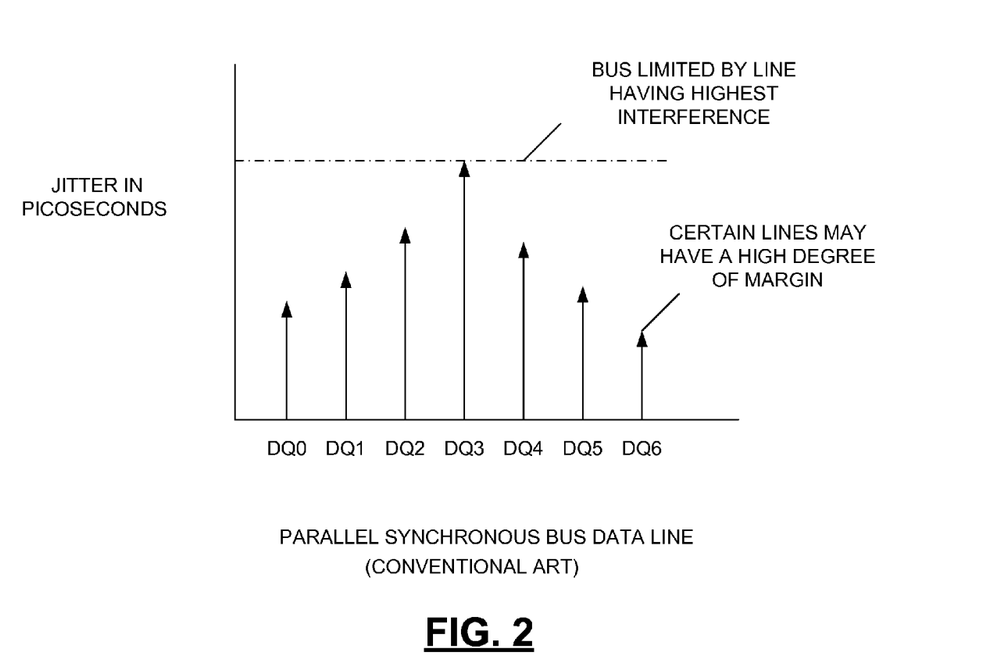
FIG. 2 is a graph depicting example crosstalk interference among evenly spaced traces of a parallel synchronous bus.

FIG. 2 is a graph depicting example crosstalk interference among evenly spaced traces of a parallel synchronous bus. The crosstalk interference is measured in mV, which is translated into jitter according to the depicted units of picoseconds. As illustrated in FIG. 2, the central data lines of an evenly spaced parallel synchronous bus are more affected by crosstalk interference and jitter than others. As noted above, the effect of crosstalk interference on a data line tends to be inversely proportional to a distance between that data line and other data lines. Data lines towards the middle of a parallel synchronous bus tend to be more susceptible to crosstalk interference because several other data lines are in close relative proximity, all of which contribute to the crosstalk interference. Data lines on the outside of the parallel synchronous bus (e.g. DQ0 and DQ6 of FIG. 1) may only have synchronously transmitting data lines on one side, resulting in less crosstalk interference and higher margins (degree of margin), allowing for higher theoretical data rates on the outside lines in comparison to data lines near the middle of the parallel synchronous bus. However, these higher theoretical data rates cannot be realized based on the synchronized data transmission constraint of the parallel synchronous bus. Thus, the data line exhibiting the highest amount of crosstalk interference (i.e., DQ3 in FIG. 2) forms a bottleneck for the parallel synchronous bus, where data cannot be transmitted along the entire bus at a clock rate greater than what the highest interference data line (DQ3) is able to handle. Accordingly, the bus is limited by the line having the highest interference.

By lowering the cross-talk interference experienced by the most affected data line, in an embodiment, the maximum data rate for that data line, and thus for the bus as a whole can be increased. One method of lowering cross-talk interference in a parallel bus is to spread the data lines further apart. While such a layout can increase the maximum achievable data rate for the most affected data line, such layout may also increase the size necessary to accommodate the parallel synchronous bus on the dielectric layer. Because available space on a dielectric layer (e.g., on a printed circuit board or ball grid array substrate) is often highly constrained, maximum bus widths permitted for a circuit interconnect design can be strictly limited and enforced.

Figure 3:
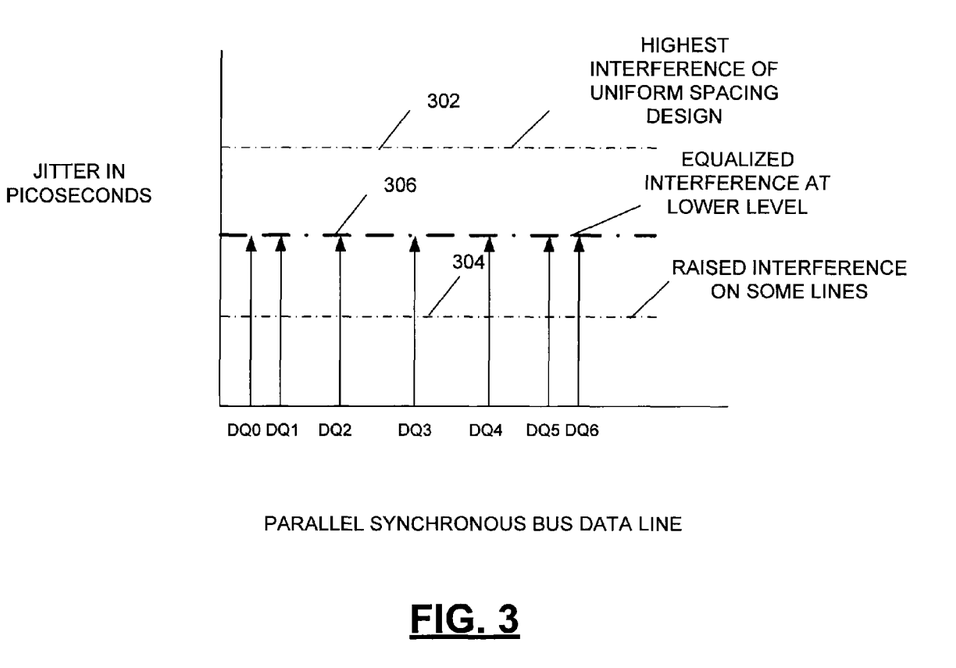
FIG. 3 is a graph depicting an example reduction in crosstalk interference at the central data lines and an increase in crosstalk interference at the outer data lines accomplished through non-uniform spacing of the data lines.

FIG. 3 is a graph depicting an example reduction in crosstalk interference at the central data lines and an increase in crosstalk interference at the outer data lines accomplished through non-uniform spacing of the data lines, as is shown in FIG. 1. Horizontal line 302 represents the highest interference level of the uniform spacing design. Horizontal line 304 represents the lowest interference level of the uniform spacing design. Horizontal line 306 represents the interference level of a non-uniform spacing design. Line 306 is equalized across the bus at a lower level than the highest interference level 302 of the uniform spacing design and raised relative to the lowest interference level 304 of the uniform spacing design. By aligning data lines further from the central data line (DQ3), the crosstalk interference experienced by the central data line is reduced from the maximum level 302 experienced when the data lines were aligned at a consistent spacing (e.g., as illustrated in FIG. 2). The crosstalk interference experienced by the outside data lines (DQ0, DQ6), whose neighbors are more closely positioned, is increased from the level 304 experienced in a consistent spacing implementation. However, such an increase in interference at the outside data lines does not harm the maximum data rate achievable by the bus because the maximum data rate achievable by the bus is based on the data line experiencing the highest level of interference. By decreasing the amount of interference experienced by the most affected data line (DQ3) in exchange for an increase on certain other data lines (e.g., DQ0 and DQ6), the maximum achievable data rate for the bus can be improved. A best maximum achievable data rate may be realized when the crosstalk interference level is equalized across all of the data lines, as shown at 306.

Figure 4:
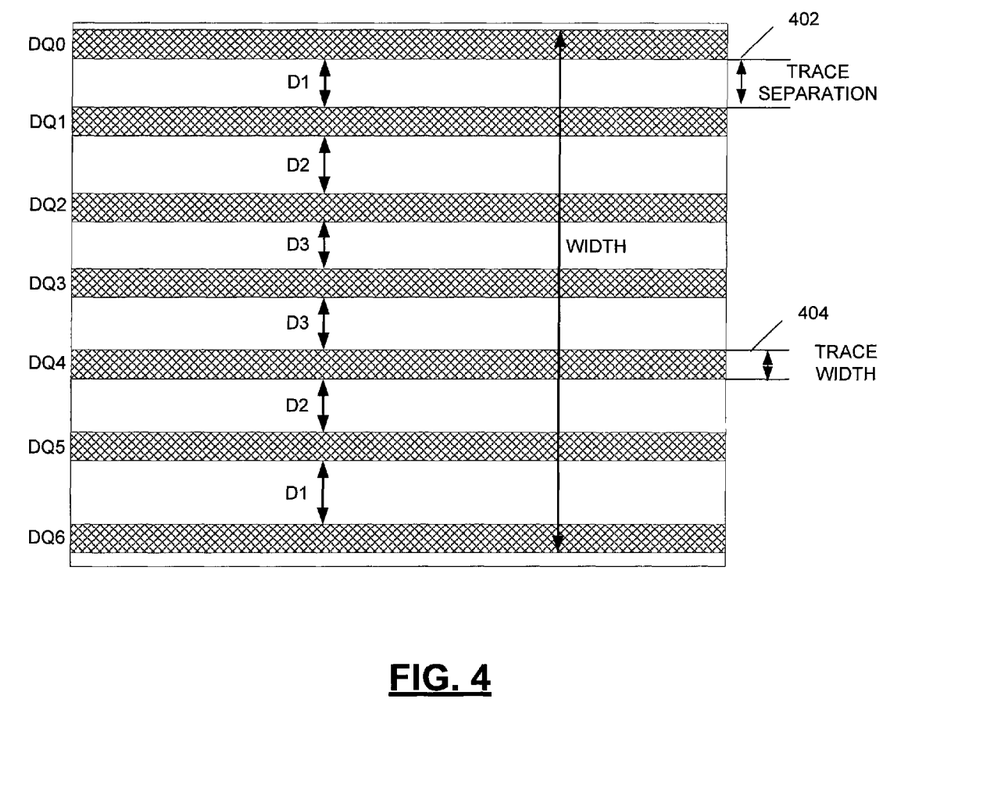
FIG. 4 provides a close up view of a portion of a parallel synchronous bus.

FIG. 4 provides a close up view of a portion of a parallel synchronous bus in accordance with an embodiment. A number of circuit design parameters may provide constraints on the positioning of data lines of a data bus (e.g., a parallel synchronous bus). As noted above, the limited amount of space available on a dielectric layer may impose a maximum bus width constraint that imposes a maximum width that a bus may occupy during all or a portion of the bus, as indicated by the Width parameter in FIG. 4. The composition of data lines, such as electrically conductive traces, bus data transfer clock rates, manufacturing tolerances, and other parameters may necessitate a minimum allowable separation threshold. The minimum allowable separation threshold constrains the minimum amount of space that must be maintained between two data lines, such as two traces (or via drill holes), throughout a parallel portion of the dielectric layer. An example space between two data lines, or trace separation, is identified at 402. Voltages and impedances used throughout a circuit interconnect may dictate parameters of the data lines themselves. For example, certain design characteristics of the circuit interconnect may mandate that a particular trace width 404 be used for the data lines of a parallel synchronous bus.

With knowledge of the design parameters and constraints of the circuit interconnect, the data lines of a parallel synchronous bus can be positioned to minimize crosstalk interference on the most affected data lines of a parallel synchronous bus, which corresponds to equalizing cross talk among the data lines, in an embodiment. As noted above, crosstalk interference is typically inversely proportional to the distance between data lines. Using this model and the constraints and parameters of the circuit interconnect, a series of simultaneous equations can be solved, as discussed below, in an embodiment, to identify potential data line spacings that would equalize crosstalk interference across the data lines. It is noted, however, that other more sophisticated interference modeling techniques that account for interference effects of components that are not in the same parallel synchronous bus, may result in a bus that has both non-uniform trace spacing as well as non-equalized interference among the various traces in order to minimize crosstalk effects at the most affected trace.

For example, with reference to FIG. 4, where a parallel synchronous bus includes seven data lines DQ0, DQ1, DQ2, DQ3, DQ4, DQ5, DQ6 (hereinafter collectively referred to as DQ0-DQ6), six trace spacings are available for manipulation to equalize crosstalk among the seven data lines, in an embodiment. Inasmuch as the crosstalk effects among the traces is symmetrical, the spacings are calculated to be symmetrical, such that the spacings between the outermost traces (DQ0, DQ6) and the first inner traces (DQ1, DQ5) are the same at both sides of the parallel synchronous bus (i.e., D1), in an embodiment. Similarly, internal spacings (D2 and D3) are selected to be symmetrical. To maximize the spacing that can be provided to the trace most affected by crosstalk interference from the other traces of the parallel synchronous bus (DQ3), and thus provide the most gain in maximum data throughput potential for the parallel synchronous bus, the outer traces (DQ0, DQ1, and DQ5, DQ6) are placed as close together as is allowable (i.e., at the minimum allowable separation threshold). Thus, a first simultaneous equation dictates that:

D1=Minimum Allowable Separation Threshold.

The maximum allowable width of the parallel synchronous bus provides a second simultaneous equation:

$$2*(D1+D2+D3)=\text{Bus Width}-(\text{Number of Traces}-1)*\text{Trace Width} \quad \text{Equation 1}$$

where Bus Width is a maximum width permitted for the parallel synchronous bus, Number of Traces is the number of traces in the parallel synchronous bus, and where Trace Width is a width of the conductive traces that are disposed within the Bus Width.

Further, in an embodiment, a third equation that equalizes the expected crosstalk interference among the data lines, is provided, where the crosstalk interference at one trace is modeled as inversely proportional to the square of the distance from the other traces:

$$\frac{1}{D1^2} + \frac{1}{(D1+D2)^2} = \frac{2}{D3^2} + \frac{2}{(D2+D3)^2} + \frac{1}{(D1+D2+D3)^2} \quad \text{Equation 2}$$

These simultaneous equations are solved to identify values of D1, D2, and D3 that will provide equalized crosstalk interference among the traces of FIG. 4, in an embodiment. For example, if the minimum allowable separation threshold is 45 µm, the bus width is 825 µm, and the Trace Width is 6*45 µm, the simultaneous equations are solved to identify: D1=45 µm, D2=167 µm, and D3=65.5 µm, in an embodiment.

Other equations may be used to determine the trace separation distances that will provide equalized crosstalk. For example, the crosstalk interference among the data lines may be modeled using a relationship other than the one described above using the inverse of the square of the distances between traces. Additionally, the equations may be modified to equalize average crosstalk interference among the traces, maximum expected (peak) crosstalk interference among the traces, or other measure of crosstalk interference.

Figure 5:
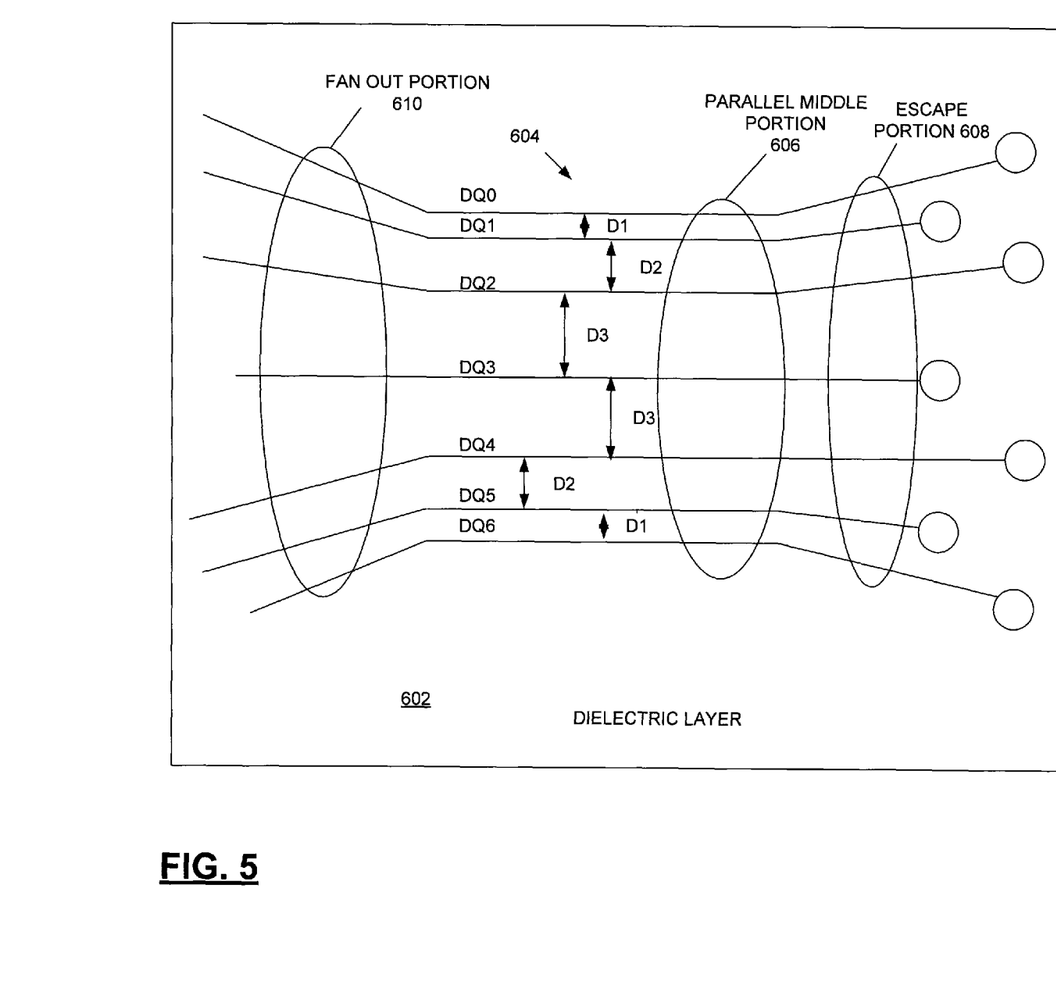
FIG. 5 depicts a circuit interconnect having data lines in the parallel middle portion spaced to equalize crosstalk interference among the data lines.

FIG. 5 depicts a circuit interconnect embodiment having data lines in the parallel middle portion spaced to equalize crosstalk interference among the data lines. The circuit interconnect includes a dielectric layer 602. The circuit interconnect further includes a parallel synchronous bus 604 disposed on the dielectric layer. The parallel synchronous bus 604 includes a plurality (e.g., at least 4) of conductive traces (DQ0, DQ1, DQ2, DQ3, DQ4, DQ5, DQ6). The conductive traces in the embodiment of FIG. 5 are non-uniformly spaced from one another (D1, D2, D3) along a parallel middle portion of the bus 606, between an escape portion 608, and a fan out portion 610 where the conductive traces are not physically aligned in parallel. In the parallel middle portion 606 the traces are physically aligned in parallel so that crosstalk interference among the conductive traces is equalized across the conductive traces so as to minimize crosstalk effects on the data line most susceptible to crosstalk Interference.

As noted above, a parallel synchronous bus typically has a middle portion, where the data lines of the bus run in parallel. In some cases, the parallel middle portion comprises the entire length of the parallel synchronous bus. In other cases, portions of the parallel synchronous bus, which transmit data in parallel, include data lines that do not physically run in parallel. The parallel synchronous bus depicted in FIG. 5 includes a parallel middle portion, indicated at 606, where the seven data lines of the bus physically run in parallel, in an embodiment. The parallel synchronous bus also includes an escape portion 608 where the data lines originate from vias, bumps, circuit components, or other origins. Because requirements of these originations may override the importance of trace layouts, the escape portion 608 may include traces that are not aligned in parallel and not manipulatable for equalizing crosstalk interference. The parallel synchronous bus also includes a fan out portion 610 where the data lines propagate to their destinations on the dielectric layer, such as vias, bumps, circuit components, or other end points. Again, the requirements of the endpoints may result in non-parallel portions of the parallel synchronous bus in the fan out region 610. However, if circuit interconnect design parameters permit, crosstalk interference in the escape portion 608 and the fan out portion 610 may be equalized as well to improve performance, as described below with respect to FIG. 7.

Figure 6A:
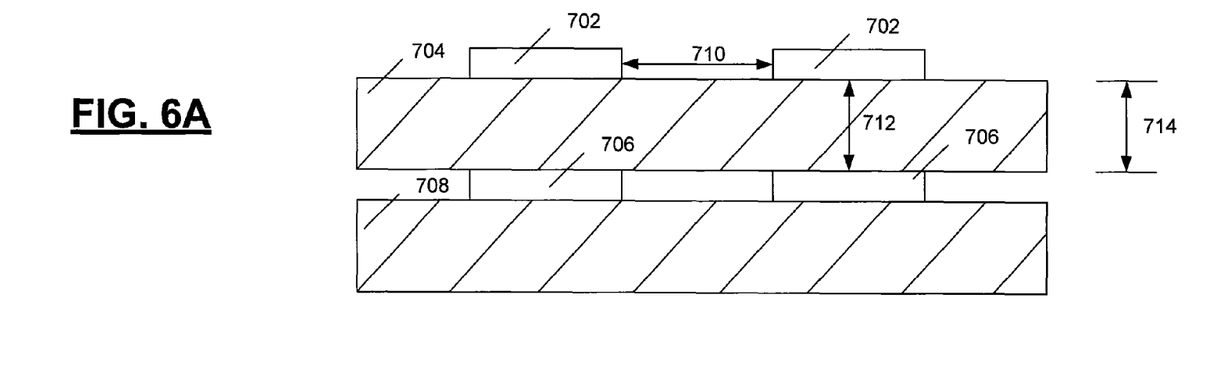
FIGS. 6A and 6B depict a multi-layer circuit interconnect where data line traces of a bus may be provided on the different layers of the circuit interconnect.
Figure 6B:
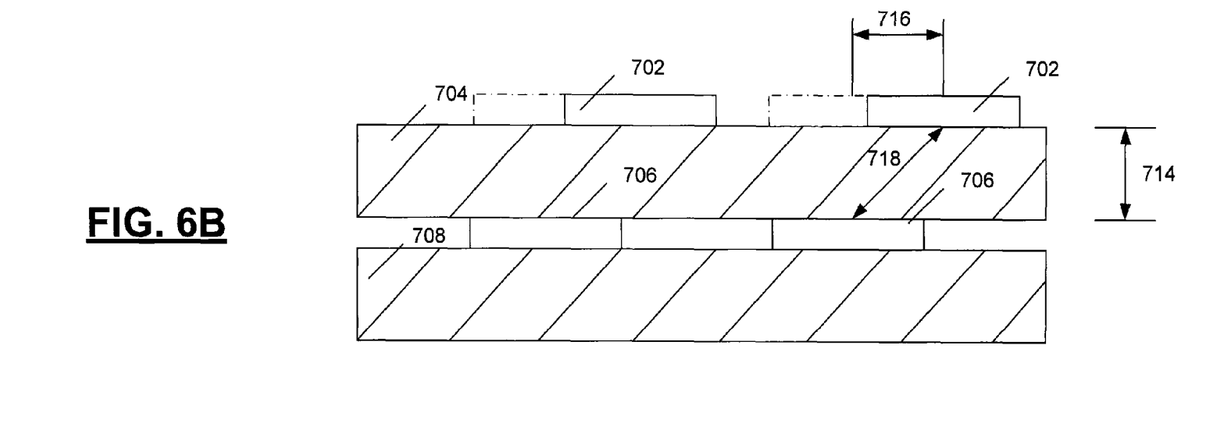

In addition to equalizing crosstalk using the spacing of data lines on a dielectric layer, in an embodiment, other parameters of a circuit interconnect can be manipulated to minimize crosstalk on the most affected data line (e.g. by equalizing crosstalk among the data lines, in an embodiment) and improve data rate performance of the circuit interconnect. FIGS. 6A and 6B depict a multi-layer circuit interconnect embodiment where data line traces of a bus are provided on the different layers of the circuit interconnect. In FIG. 6A, two traces 702 of a parallel synchronous bus are positioned on top of a first dielectric layer 704, and two traces 706 of the same parallel synchronous bus are positioned between the first dielectric layer 704 and the second dielectric layer 708. As discussed in detail above, crosstalk interference experienced by a trace tends to be related to the distance between a given trace and other traces that are synchronously transmitting data. In the example of FIG. 6A, distances between traces are controlled not only by their positioning on a dielectric layer, as indicated at 710, but also by the distance between traces positioned on different dielectric layers, as indicated at 712, which can be accomplished by varying the thickness 714 of the first dielectric layer 704, for example.

FIG. 6B illustrates a further mechanism for manipulating distances between traces where a distance between a trace 702 on the first dielectric layer 704 is distanced from a trace 706 on the second dielectric layer 708 by both the thickness 714 of the first dielectric layer 704 as well as a shifting 716 of the traces 702 on the first dielectric layer 704 from their position in FIG. 6A. The combination of the thickness 714 and the shifting 716 results in the distance between traces identified at 718.

Figure 7:
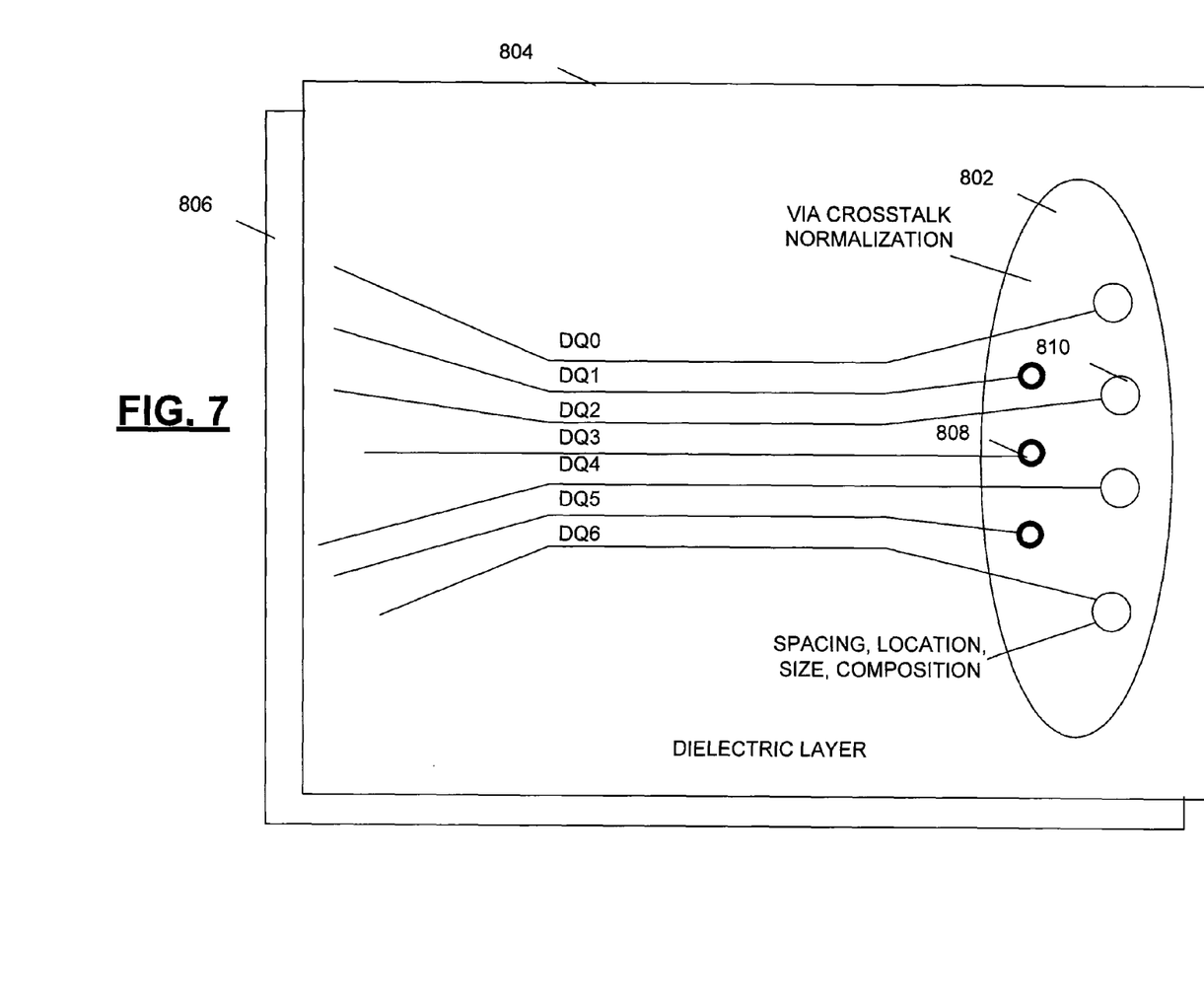
FIG. 7 depicts the equalization of crosstalk among vias of a circuit interconnect.

Other circuit interconnect components, such as vias at the ends of data lines DQ0, DQ1, DQ2, DQ3, DQ4, DQ5, DQ6 as shown in FIG. 7, can also be adjusted to minimize crosstalk interference at the data signal line most affected by crosstalk, in an embodiment. FIG. 7 depicts the manipulation of crosstalk affects among vias of a circuit interconnect. The vias 802 (e.g., through holes, plated through-holes, buried vias, micro-vias, and laser vias) provide mechanisms for communicating electrical signals, such as those conveying data, from one layer 804 to another 806 of the circuit interconnect. For example, in an embodiment the vias 802 are plated through holes that can be used to carry data signals. Parameters of the vias, such as their positioning, relative locations, size, and composition can be varied to provide desired crosstalk interference manipulation among the vias and/or other circuit interconnect elements so as to minimize the crosstalk interface along a path, most affected by crosstalk interference, for carrying data in a parallel synchronous bus. For example, in implementations where one or more parameters of the vias of a printed circuit board or ball grid array substrate are constrained (e.g., positions of the vias), other parameters (e.g., size and composition) can be varied to manipulate crosstalk interference experienced at the vias. For example, in the example of FIG. 7, certain vias 808 are implemented in a different size and/or material composition than other vias 810, as indicated by the different depicted sizes and line thicknesses to provide crosstalk normalization of the vias.

In addition to traces and vias, characteristics of ballmap definitions of a package, connector pin assignments, and other components can be adjusted to minimize crosstalk interference at the most affected data signal path and improve performance.

This written description uses examples to disclose the invention, including the best mode, and also to enable a person skilled in the art to make and use the invention. The patentable scope of the invention may include other examples.

For example, a circuit interconnect can take a variety of forms, such as a printed circuit board, a hybrid circuit, a multi-chip module, a monolithic microwave integrated circuit, a solid logic technology (SLT) circuit, a solid logic dense (SLD) circuit, an advanced solid logic technology (ASLT) circuit, a ball grid array (BGA) substrate package, a package substrate, or a monolithic system technology (MST) circuit.

As another example, non-uniform spacing between signal carriers can be implemented in a silicon package where high coupling between synchronously transmitting nets can result in crosstalk interference bottlenecks. The signal carriers in the silicon package can be spaced using the procedures described herein to equalize crosstalk interference and increase maximum achievable data rates.

As a further example, equalization may be provided within certain ranges such that the crosstalk interference levels expected to be experienced at each of the signal carriers of a parallel synchronous bus are substantially equal (e.g., within 10%, within 2%, within 1%).

It is noted that as used in the description herein and throughout the claims that follow, the meaning of "a," "an," and "the" includes plural reference unless the context clearly dictates otherwise. Further, as used in the description herein and throughout the claims that follow, the meanings of "and" and "or" include both the conjunctive and disjunctive and may be used interchangeably unless the context expressly dictates otherwise.

What is claimed is:

1. A circuit interconnect, comprising:
a dielectric layer; and
a parallel synchronous bus disposed on the dielectric layer, the parallel synchronous bus comprising at least four conductive traces, the at least four conductive traces being non-uniformly spaced from one another along a portion of the bus where the at least four conductive traces are physically aligned in parallel so that crosstalk interference among the at least four conductive traces is substantially equalized across the at least four conductive traces, wherein different ones of the at least four conductive traces are positioned on different dielectric layers of a multi-layer interconnect.

2. A circuit interconnect, comprising:
a dielectric layer; and
a parallel synchronous bus disposed on the dielectric layer, the parallel synchronous bus comprising at least four conductive traces, the at least four conductive traces being non-uniformly spaced from one another along a portion of the bus where the at least four conductive traces are physically aligned in parallel so that crosstalk interference among the at least four conductive traces is substantially equalized across the at least four conductive traces, the at least four conductive traces including a first trace, a second trace, and a third trace, a distance between the first trace and the second trace being smaller than the distance between the second trace and the third trace, the distance between the first trace and the second trace being set according to a minimum allowed separation threshold, the first trace being at a side of the parallel synchronous bus.

3. The circuit interconnect of claim 2, wherein the first trace is next to the second trace and the second trace is next to the third trace.

4. The circuit interconnect of claim 2, wherein the circuit interconnect is one of a printed circuit board, a hybrid circuit, a multi-chip module, a monolithic microwave integrated circuit, a solid logic technology (SLT) circuit, a solid logic dense (SLD) circuit, an advanced solid logic technology (ASLT) circuit, a ball grid array (BGA) substrate package, a package substrate, and a monolithic system technology (MST) circuit.

5. The circuit interconnect of claim 2, wherein the at least four conductive traces are spaced based on a maximum width value for the parallel synchronous bus.

6. The circuit interconnect of claim 2, wherein the crosstalk interference of one trace of the at least four traces is inversely proportional to a distance between the one trace and other trace of the at least four traces squared.

7. The circuit interconnect of claim 2, wherein the parallel synchronous bus includes an outside trace of the at least four traces and a middle trace of the at least four traces, wherein the at least four conductive traces are spaced so that a level of the crosstalk interference experienced by the outside trace is equal to the level of the crosstalk interference experienced by the middle trace.

8. The circuit interconnect of claim 2, wherein data is transmitted along the at least four conductive traces synchronously according to a clock signal.

9. The circuit interconnect of claim 2, wherein the crosstalk interference is litter interference.

10. The circuit interconnect of claim 2, wherein the equalization results in the crosstalk interference among the at least four traces being at a substantially equal average level or a substantially equal maximum expected level.

11. The circuit interconnect of claim 2, wherein the parallel synchronous bus includes an escape portion, a parallel middle portion, and a fan out portion, wherein the at least four conductive traces are spaced to equalize the crosstalk interference in the parallel middle portion of the parallel synchronous bus.

12. The circuit interconnect of claim 11, wherein the at least four conductive traces are not physically aligned in parallel in the escape portion and the fan out portion of the parallel synchronous bus.

13. A circuit interconnect, comprising:

a dielectric layer; and a parallel synchronous bus disposed on the dielectric layer, the parallel synchronous bus comprising at least four conductive traces, the at least four conductive traces being non-uniformly spaced from one another along a portion of the bus where the at least four conductive traces are physically aligned in parallel so that crosstalk interference among the at least four conductive traces is substantially equalized across the at least four conductive traces;

a second dielectric layer; and a second layer trace on the second dielectric layer, wherein the second layer trace is a part of the parallel synchronous bus, wherein the second layer trace is spaced from the at least four conductive traces on the dielectric layer so that the crosstalk interference among the at least four conductive traces on the dielectric layer and the second layer trace is substantially equalized.

* * * * *